(12) United States Patent
Fukushima

(10) Patent No.: US 10,181,418 B2
(45) Date of Patent: Jan. 15, 2019

(54) SUBSTRATE POSITION ALIGNMENT DEVICE AND CONTROL METHOD OF SUBSTRATE POSITION ALIGNMENT DEVICE

(71) Applicant: KAWASAKI JUKOGYO KABUSHIKI KAISHA, Kobe-shi, Hyogo (JP)

(72) Inventor: Takayuki Fukushima, Takarazuka (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 321 days.

(21) Appl. No.: 15/105,283

(22) PCT Filed: Dec. 15, 2014

(86) PCT No.: PCT/JP2014/006234
§ 371 (c)(1),
(2) Date: Jun. 16, 2016

(87) PCT Pub. No.: WO2015/093035
PCT Pub. Date: Jun. 25, 2015

(65) Prior Publication Data
US 2016/0322248 A1 Nov. 3, 2016

(30) Foreign Application Priority Data

Dec. 16, 2013 (JP) ................................. 2013-258768

(51) Int. Cl.
*H01L 21/68* (2006.01)
*H01L 21/687* (2006.01)
*H01L 23/544* (2006.01)

(52) U.S. Cl.
CPC ............ *H01L 21/681* (2013.01); *H01L 21/68* (2013.01); *H01L 21/68707* (2013.01);
(Continued)

(58) Field of Classification Search
CPC ............ H01L 21/681; H01L 21/68721; H01L 21/68771; H01L 21/68785
See application file for complete search history.

(56) References Cited

U.S. PATENT DOCUMENTS 6,052,913 A * 4/2000 Kaneko .................. H01L 21/68
33/533
6,658,321 B2 * 12/2003 Osaka ............... H01L 21/67276
700/218
(Continued)

FOREIGN PATENT DOCUMENTS

JP 2000-294619 A 10/2000
JP 2000294619 A * 10/2000 ........... H01L 21/681
(Continued)

OTHER PUBLICATIONS

Mar. 10, 2015 Search Report issued in International Patent Application No. PCT/JP2014/006234.
(Continued)

*Primary Examiner* — Gerald McClain
(74) *Attorney, Agent, or Firm* — Oliff PLC

(57) ABSTRACT

A substrate position alignment device includes a plurality of rotary tables which hold a plurality of substrates to be vertically spaced apart from each other, a rotation drive device which synchronously rotates the plurality of rotary tables, a plurality of support elements which support the substrate on the rotary table, support element drive members which independently and horizontally move the plurality of support elements between inward positions and outward positions, and up-down devices which move up and down the plurality of support element drive members. The substrate position alignment device operates the rotation drive device, the support element drive members and the up-down device based on the positions of notches of the substrate, to (Continued)

align the notches of the plurality of substrates with a reference rotational angle position.

8 Claims, 12 Drawing Sheets

(52) U.S. Cl.
CPC .. *H01L 21/68742* (2013.01); *H01L 21/68764* (2013.01); *H01L 21/68792* (2013.01); *H01L 23/544* (2013.01); *H01L 2223/54426* (2013.01); *H01L 2223/54486* (2013.01)

(56) References Cited

U.S. PATENT DOCUMENTS

| | | | | |
|---|---|---|---|---|
| 7,790,052 B2 * | 9/2010 | Park | ................ | H01L 21/67778 134/1.3 |
| 9,947,566 B2 * | 4/2018 | Goto | ................ | H01L 21/67766 |
| 2002/0070095 A1 * | 6/2002 | Osaka | ................ | H01L 21/681 198/394 |
| 2013/0291798 A1 * | 11/2013 | Lee | ................ | C23C 16/4584 118/730 |
| 2016/0322248 A1 * | 11/2016 | Fukushima | ............ | H01L 21/68 |

FOREIGN PATENT DOCUMENTS

| | | | | |
|---|---|---|---|---|
| JP | 2008-300609 A | | 12/2008 | |
| JP | 2008300609 A | * | 12/2008 | |
| JP | 2015115562 A | * | 6/2015 | ............ H01L 21/68 |
| KR | 2001-0006965 A | | 1/2001 | |
| KR | 10-0558774 B1 | | 4/2007 | |
| TW | 451384 B | | 8/2001 | |

OTHER PUBLICATIONS

Jun. 21, 2016 International Preliminary Report on Patentability issued in International Patent Application No. PCT/JP2014/006234.

* cited by examiner

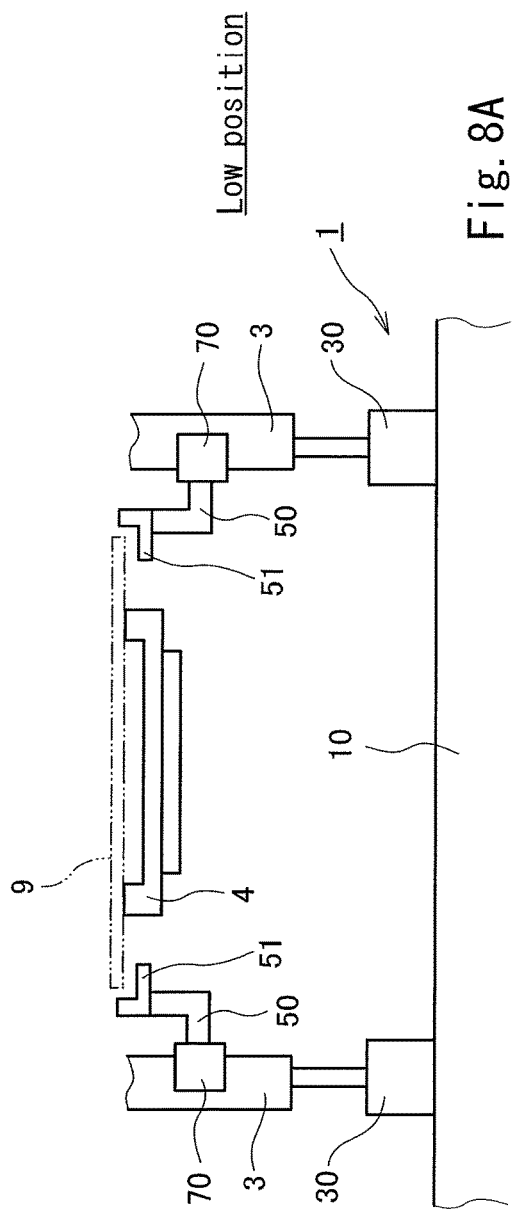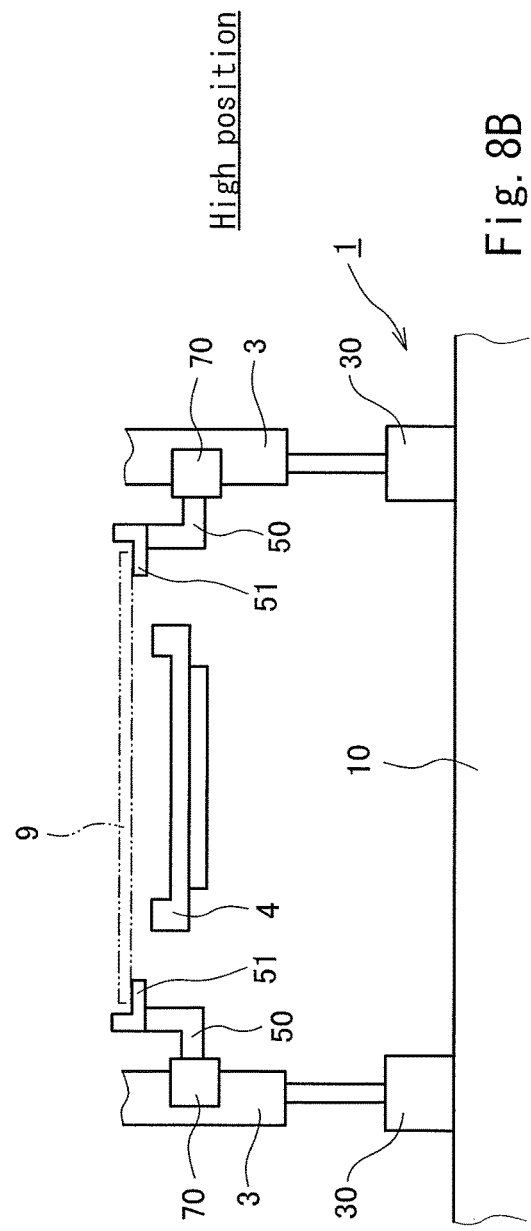

SUBSTRATE POSITION ALIGNMENT DEVICE AND CONTROL METHOD OF SUBSTRATE POSITION ALIGNMENT DEVICE

TECHNICAL FIELD

The present invention relates to a substrate position alignment device which aligns the rotational angle positions of a plurality of substrates, and a control method of the substrate position alignment device.

BACKGROUND ART

In the manufacturing steps of semiconductor, a substrate position alignment device (aligner) which aligns the rotational angle positions of a plurality of semiconductor wafers with a reference rotational angle position is used to conform the crystal directions of the semiconductor wafers to each other. To this end, the semiconductor wafers are provided with notches which are marks indicating the crystal directions of the semiconductor wafers, respectively. An example of the substrate position alignment device is disclosed in Patent Literature 1. In the substrate position alignment device disclosed in Patent Literature 1, three support poles are provided to extend vertically upward from the peripheral edge of one turn table, along the circumferential direction of the turn table, and each of the support poles is provided with five support pins which are equally spaced apart from each other in a vertical direction. The three support pins disposed at the same height position, of the three support poles, support the peripheral edge portion of one semiconductor wafer. On the outer side of the three support poles, three scooping poles are provided in such a manner that these scooping poles are movable up and down and are movable to be close to and away from the rotational center axis of the turn table. Each of the scooping poles is provided with five scooping pins which are equally spaced apart from each other in the vertical direction. A vertical spacing between adjacent scooping pins is set to be smaller than that of adjacent support pins. On the outer side of the three support poles, a sensor pole provided with a sensor for detecting the notches of the five semiconductor wafers supported by the support pins is provided.

Initially, each of the semiconductor wafers is supported by the three support pins disposed at the same height position. During a substrate position alignment operation, the turn table is rotated once, the sensor detects the notches to thereby detect the rotational angle positions of the notches of all of the semiconductor wafers, namely, misalignment angles from a reference rotational angle position, and the rotational angle positions are stored in a memory. Based on the rotational angle position stored in the memory, the turn table is rotated to align the rotational angle position of the lowermost semiconductor wafer (semiconductor wafer located at a lowermost position, of the plurality of semiconductor wafers) with the reference rotational angle position. Then, the three scooping poles are moved in an inward direction toward the turn table and moved up so that the scooping pins lift-up the lowermost semiconductor wafer for which the alignment of the rotational angle position is completed. As described above, the vertical spacing between adjacent scooping pins is set to be smaller than that of the adjacent support pins. Therefore, while maintaining a state in which only the lowermost semiconductor wafer is scooped up, the remaining four semiconductor wafers continue to be placed on the support pins. Then, based on the rotational angle position stored in the memory, the turn table is rotated to align the rotational angle position of the second semiconductor wafer from the bottom with the reference rotational angle position, and this semiconductor wafer is scooped up by the scooping pins in the above-described manner. In this way, the rotational angle positions of the five semiconductor wafers are sequentially aligned with the reference rotational angle position.

CITATION LIST

Patent Literature

Patent Literature 1: Japanese Laid-Open Patent Application Publication No. 2000-294619

SUMMARY OF INVENTION

Technical Problem

In the device disclosed in Patent Literature 1, the rotational angle positions of the plurality of semiconductor wafers are sequentially aligned with the reference rotational angle position, starting from the lowermost semiconductor wafer. In other words, in the device disclosed in Patent Literature 1, the rotational angle positions of the plurality of semiconductor wafers cannot be aligned with the reference rotational angle position, in a desired order. However, in actual cases, the misalignment angles of the plurality of semiconductor wafers are non-uniform. For this reason, in the device disclosed in Patent Literature 1, it takes long time from when the position alignment operation starts until the position alignment operations for all of the plurality of semiconductor wafers are completed.

An object of the present invention is to provide a substrate position alignment device which is capable of aligning the rotational angle positions of substrates with a reference rotational angle position, in a desired order, and a control method of this substrate position alignment device.

Solution to Problem

According to an aspect of the present invention, a substrate position alignment device comprises: a plurality of rotary tables disposed to be vertically spaced apart from each other to hold a plurality of substrates in such a manner that the plurality of substrates are placed to extend horizontally and arranged to be vertically spaced apart from each other, the plurality of rotary tables being rotatable around an axis extending vertically; a rotation drive device which synchronously rotates the plurality of rotary tables; a plurality of mark position detecting units which detect rotational angle positions of marks of the plurality of substrates which are held on the plurality of rotary tables and rotated by the plurality of rotary tables, respectively; a plurality of support element sets configured to support peripheral edge portions of the plurality of substrates to be held on the plurality of rotary tables, respectively; a plurality of support element set drive member units configured to independently support the plurality of support element sets, respectively, and to independently move the plurality of support element sets, respectively, between inward positions at which the plurality of support element sets are located inward relative to outer peripheries of the plurality of substrates, respectively, and outward positions at which the plurality of support element sets are located outward relative to the outer peripheries of the plurality of substrates, respectively; and an up-down mechanism which moves up and down the plurality of support element set drive member units together, between high positions and low positions in a predetermined height range. The plurality of support element sets disposed at the high positions are set to be higher than the plurality of substrates held on the plurality of rotary tables corresponding to the plurality of support element sets, respectively, and the plurality of support element sets disposed at the low positions are set to be lower than the plurality of substrates held on the plurality of rotary tables corresponding to the plurality of support element sets, respectively, and the rotation drive device, the plurality of support element set drive member units, and the up-down mechanism are operated based on the rotational angle positions of the marks of the plurality of substrates which are detected by the plurality of mark position detecting units, respectively, to align the marks of the plurality of substrates with a reference rotational angle position.

In accordance with this configuration, the rotation drive device synchronously rotates the plurality of rotary tables, the plurality of mark position detecting units detect the rotational angle positions of the marks such as notches or orientation flats, of the plurality of substrates held on the plurality of rotary tables, respectively, and then, the rotational angle position of the mark of one substrate is aligned with the reference rotational angle position (hereinafter this will be referred to as position alignment). The support element set drive member unit corresponding to the support element set corresponding to the substrate for which the position alignment is completed moves this support element set to the inward position, while the support element set drive member units corresponding to the support element sets corresponding to the substrates for which the position alignment is not completed yet move these support element sets to the outward positions, respectively. After that, the up-down mechanism moves the plurality of support element set drive member units together to the high positions, respectively, and thereby only the substrate for which the position alignment is completed is lifted-up from the rotary table (hereinafter this will be referred to as substrate lift-up). After that, the remaining substrates sequentially go through the position alignment and the substrate lift-up, and thus the position alignment for all of the substrate is completed. In this way, the position alignment for the marks of the plurality of substrates can be performed in a desired order. Therefore, by selecting an optimal order of the position alignment according to the rotational angle positions of the marks of the plurality of substrates, which are detected by the plurality of mark position detecting units, respectively, the position alignment for the marks of the plurality of substrates can be performed in a shortest time.

The substrate position alignment device may further comprise: a control unit which receives as inputs the rotational angle positions of the marks of the plurality of substrates which are detected by the plurality of mark position detecting units, respectively, and controls the rotation drive device, the plurality of support element set drive member units, and the up-down mechanism; and a memory unit, wherein the control unit may be configured to perform: a mark position detecting operation in which the control unit causes the rotation drive device to synchronously rotate the plurality of rotary tables and causes the memory unit to store the rotational angle positions of the marks of the plurality of substrates held on the plurality of rotary tables, respectively, the rotational angle positions being detected by the plurality of mark position detecting units, respectively, and a sequential substrate position alignment operation in such a manner that the plurality of substrates sequentially go through the sequential substrate position alignment operation, the sequential substrate position alignment operation including: position alignment performed in such a manner that the rotation drive device synchronously rotates the plurality of rotary tables to align the rotational angle position of the mark of a specified substrate of the plurality of substrates with the reference rotational angle position, using the rotational angle position of the mark of the specified substrate which is stored in the memory unit, and substrate lift-up performed in such a manner that the support element set drive member unit corresponding to the support element set corresponding to the specified substrate for which the position alignment is completed, moves the support element set to the inward position, the support element set drive member units corresponding to the support element sets corresponding to the substrates for which the position alignment is not completed, move the support element sets to the outward positions, respectively, and then the up-down mechanism moves the plurality of support element set drive member units together to the high positions, respectively, to lift-up only the substrate for which the position alignment is completed, from the rotary table.

In accordance with this configuration, under control of the control unit, the rotational angle positions of the plurality of substrates can be sequentially and automatically aligned with the reference rotational angle position.

The control unit may be configured to perform: a substrate receiving operation in which the up-down mechanism moves the plurality of support element set drive member units to the high positions, respectively, and the plurality of support element set drive member units move the plurality of support element sets to the inward positions, respectively, and a substrate holding operation in which after the plurality of substrates are transferred to and placed on the plurality of support element sets which have completed the substrate receiving operation, the up-down mechanism moves the plurality of support element set drive member units to the low positions, respectively, to cause the plurality of substrates to be held on the plurality of rotary tables, respectively, and the control unit may be configured to perform the mark position detecting operation and the sequential substrate position alignment operation, after the substrate holding operation.

In accordance with this configuration, under control of the control unit, reception of the substrate and placement of the substrate onto the rotary table can be performed automatically.

The control unit may be configured to calculate an order of the position alignment for the plurality of substrates, in which a rotation amount of the rotary tables which is required to perform the position alignment for all of the plurality of substrates is smallest, based on the rotational angle positions of the marks of the plurality of substrates which are stored in the memory unit, and to perform the position alignment for the plurality of substrates in the calculated order in the sequential substrate position alignment operation.

In accordance with this configuration, the position alignment for the plurality of substrates can be performed in the calculated order, in a shortest time.

The up-down mechanism may include a plurality of support column members disposed on a virtual circle having the axis as a center in such a manner that the support column members extend vertically to be spaced apart from each other in a circumferential direction of the virtual circle, a plurality of separate support element drive members provided on each of the support columnar members at height positions corresponding to the plurality of rotary tables, respectively, and up-down devices which synchronously move up and down the plurality of support column members, and each of the plurality of support element sets may include a plurality of support elements configured to support a plurality of peripheral edge portions in the circumferential direction, of the substrate held on the rotary table corresponding to the each of the plurality of support element sets. Each of the plurality of support element set drive member units may include the plurality of separate support element drive members configured to independently support the plurality of support elements included in the support element set corresponding to the each of the plurality of support element set drive member units, and synchronously move the plurality of support elements between the inward positions and the outward positions.

In accordance with this configuration, as in the above, the position alignment for the marks of the plurality of substrates can be performed in a shortest time.

The substrate position alignment device may comprise: a base body which supports the plurality of rotary tables disposed to be vertically spaced apart from each other to hold the plurality of substrates in such a manner that the plurality of substrates are placed to extend horizontally and arranged to be vertically spaced apart from each other, the plurality of rotary tables being rotatable around the axis extending vertically; one rotation drive source; and a rotational driving force transmission mechanism which is provided on the base body and transmits a rotational driving force of the rotation drive source to the plurality of rotary tables to synchronously rotate the plurality of rotary tables.

In accordance with this configuration, by providing the rotational driving force transmission mechanism, the rotation drive source of the rotary tables can be disposed at a spatial position that is distant from the rotary tables. In this way, a sufficient space can be obtained for the rotation drive source. In other words, a design in the layout of the rotation drive source becomes more flexible.

According to another aspect of the present invention, a control method of a substrate position alignment device is used in the substrate position alignment device including: a plurality of rotary tables disposed to be vertically spaced apart from each other to hold a plurality of substrates in such a manner that the plurality of substrates are placed to extend horizontally and arranged to be vertically spaced apart from each other, the plurality of rotary tables being rotatable around an axis extending vertically; a rotation drive device which synchronously rotates the plurality of rotary tables; a plurality of mark position detecting units which detect rotational angle positions of marks of the plurality of substrates which are held on the plurality of rotary tables and rotated by the plurality of rotary tables, respectively; a plurality of support element sets configured to support peripheral edge portions of the plurality of substrates to be held on the plurality of rotary tables, respectively; a plurality of support element set drive member units configured to independently support the plurality of support element sets, respectively, and to independently move the plurality of support element sets, respectively, between inward positions at which the plurality of support element sets are located inward relative to outer peripheries of the plurality of substrates, respectively, and outward positions at which the plurality of support element sets are located outward relative to outer peripheries of the plurality of substrates, respectively; an up-down mechanism which moves up and down the plurality of support element set drive member units together, between high positions and low positions in a predetermined height range, a control unit which receives as inputs the rotational angle positions of the marks of the plurality of substrates which are detected by the plurality of mark position detecting units, respectively, and controls the rotation drive device, the plurality of support element set drive member units, and the up-down mechanism; and a memory unit, wherein the plurality of support element sets disposed at the high positions are set to be higher than the plurality of substrates held on the plurality of rotary tables corresponding to the plurality of support element sets, respectively, and the plurality of support element sets disposed at the low positions are set to be lower than the plurality of substrates held on the plurality of rotary tables corresponding to the plurality of support element sets, respectively. The control method comprises: performing with the control unit, a mark position detecting operation in which the control unit causes the rotation drive device to synchronously rotate the plurality of rotary tables and causes the memory unit to store the rotational angle positions of the marks of the plurality of substrates held on the plurality of rotary tables, respectively, the rotational angle positions being detected by the plurality of mark position detecting units, respectively, and a sequential substrate position alignment operation in such a manner that the plurality of substrates sequentially go through the sequential substrate position alignment operation, the sequential substrate position alignment operation including: position alignment performed in such a manner that the rotation drive device synchronously rotates the plurality of rotary tables to align the rotational angle position of the mark of a specified substrate of the plurality of substrates with the reference rotational angle position, using the rotational angle position of the mark of the specified substrate which is stored in the memory unit, and substrate lift-up performed in such a manner that the support element set drive member unit corresponding to the support element set corresponding to the specified substrate for which the position alignment is completed, moves the support element set to the inward position, the support element set drive member units corresponding to the support element sets corresponding to the substrates for which the position alignment is not completed, move the support element sets to the outward positions, respectively, and then the up-down mechanism moves the plurality of support element set drive member units together to the high positions, respectively, to lift-up only the substrate for which the position alignment is completed, from the rotary table.

Advantageous Effects of Invention

As should be clearly understood from the above, in accordance with the present invention, by selecting an optimal order of the position alignment according to the rotational angle positions of the marks of the plurality of substrates which are detected by a plurality of mark position detecting units, respectively, the position alignment for the marks of the plurality of substrates can be performed in a shortest time.

BRIEF DESCRIPTION OF DRAWINGS

FIGS. 8A and 8B are enlarged views each showing a vertical positional relationship between the support column members, the support elements and the rotary tables.

DESCRIPTION OF EMBODIMENTS

Hereinafter, the embodiments of the present invention will be described in detail with reference to the drawings. In the description below, the same or corresponding elements are designated by the same reference symbols throughout the drawings, and will not be described repeatedly. Also, in the description below, an up-down direction refers to a vertical direction.

As substrates, semiconductor wafers of a disc shape will be exemplarily described. However, the substrates are not limited to the semiconductor wafers. For example, the substrates may be glass substrates for use in a thin liquid crystal display and an organic EL display, which are treated in a semiconductor process. The semiconductor wafers are the substrate material of a semiconductor device, and include silicon wafers, silicon carbide wafers, sapphire wafers, etc. The semiconductor wafers have crystal directions (orientations). To treat the semiconductor wafers in the semiconductor process, the crystal directions are required to conform to each other. The rotational angle position which is a reference in the treatment of the semiconductor wafers will be referred to as a reference rotational angle position.

(Embodiment 1)

<Overall Configuration of Substrate Treatment System>

Figure 1:
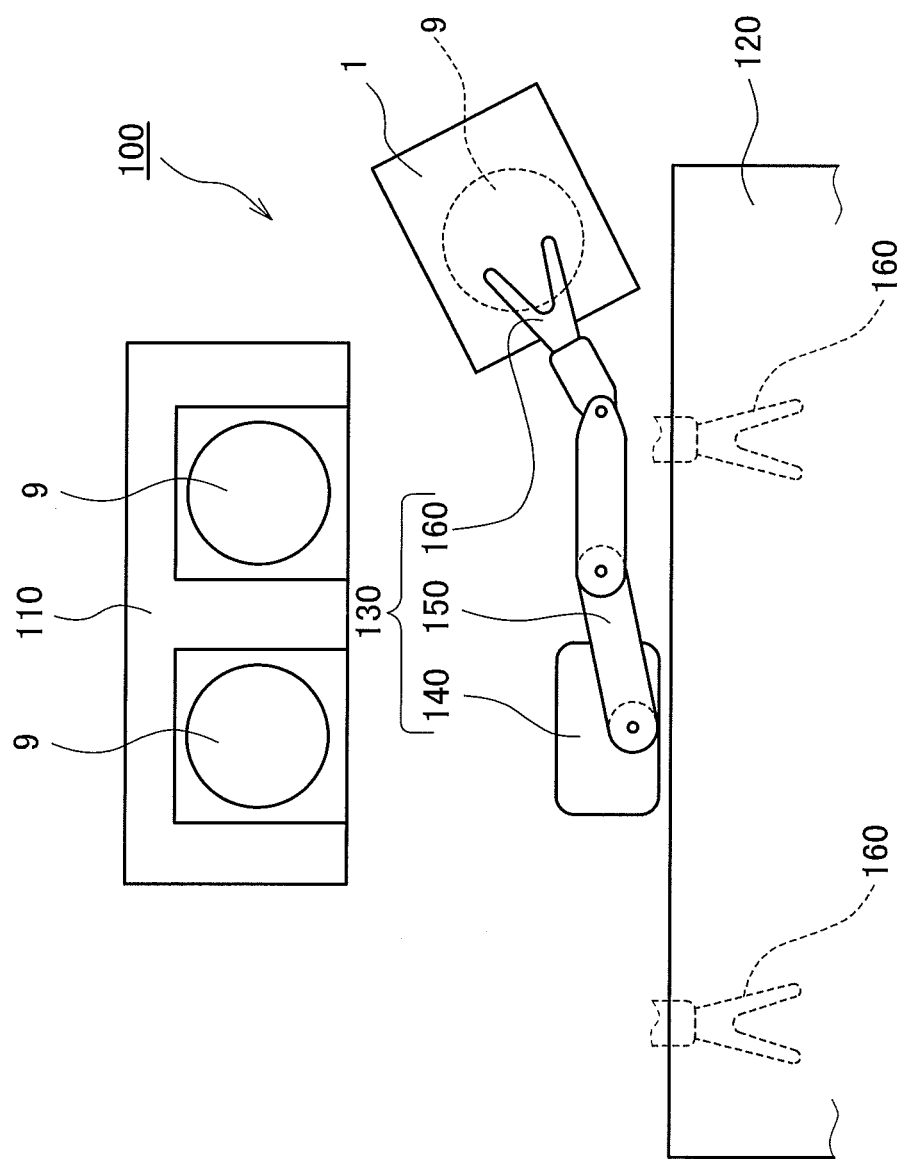
FIG. 1 is a plan view showing the overall configuration of a substrate treatment system including a substrate position alignment device according to Embodiment 1 of the present invention.

FIG. 1 is a plan view showing the overall configuration of a substrate treatment system 100 including a substrate position alignment device according to Embodiment 1 of the present invention. As shown in FIG. 1, the substrate treatment system 100 includes a storage unit 110 which stores a plurality of semiconductor wafers 9 therein, a substrate position alignment device 1 which aligns the rotational angle positions of the plurality of semiconductor wafers 9 with the reference rotational angle position, a treatment (processing) device 120 which performs specified treatments such as a thermal treatment and a thin-firm forming process, for the semiconductor wafers 9, and a transfer robot 130 which transfers the semiconductor wafers 9, among the storage unit 110, the substrate position alignment device 1, and the treatment device 120. The transfer robot 130 and the substrate position alignment device 1 are disposed between the treatment device 120 and the storage unit 110. At an initial state, the rotational angle positions of the semiconductor wafers 9 stored in the storage unit 110 are not aligned with the reference rotational angle position yet, and are not subjected to the specified treatment.

The transfer robot 130 includes a base member 140, an aim unit 150 which includes a plurality of arms coupled to each other in such a manner that the arms are rotatable with respect to each other, and is provided on the base member 140 in such a manner that the arm unit 150 is rotatable within a horizontal plane, and a hand 160 which is provided at the tip end portion of the arm unit 150 and holds the plurality of semiconductor wafers 9 in a state in which the semiconductor wafers 9 are vertically spaced apart from each other. The transfer robot 130 rotates the arm unit 150 to cause the hand 160 to take the plurality of semiconductor wafers 9 which are untreated, out of the storage unit 110, and transfers the plurality of semiconductor wafers 9 to the substrate position alignment device 1. After that, the transfer robot 130 moves the hand 160 back off from the substrate position alignment device 1. After the plurality of semiconductor wafers 9 are stored in the substrate position alignment device 1 in a state in which the semiconductor wafers 9 are vertically spaced apart from each other, the substrate position alignment device 1 rotates the plurality of semiconductor wafers 9 to align their rotational angle positions with the reference rotational angle position. The transfer robot 130 causes the hand 160 to take the plurality of semiconductor wafers 9 whose rotational angle positions have been aligned with the reference rotational angle position, out of the substrate position alignment device 1, and transfer the plurality of semiconductor wafers 9 to the treatment device 120. After the treatment device 120 has treated the plurality of semiconductor wafers 9, the transfer robot 130 causes the hand 160 to take the semiconductor wafers 9, out of the treatment device 120, and moves the semiconductor wafers 9 back to the storage unit 110. Hereinafter, a case where the substrate position alignment device 1 aligns the rotational angle positions of five semiconductor wafers 9 with the reference rotational angle position, will be exemplarily described. However, the number of the semiconductor wafers 9 is not limited to five.

Figures 2A, 2B:
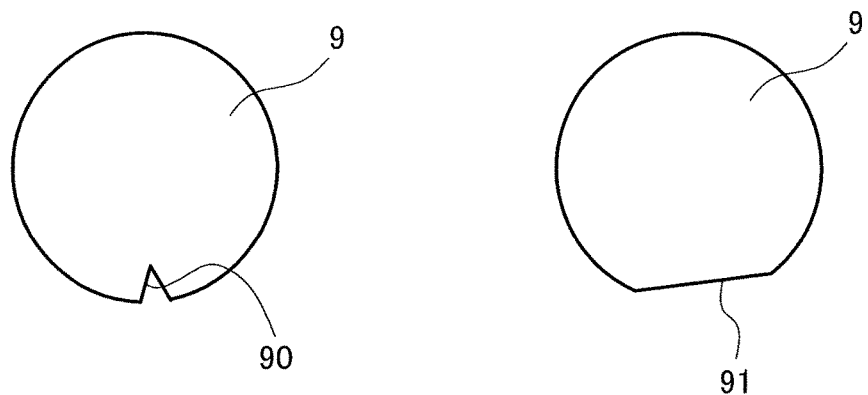
FIGS. 2A and 2B are plan views showing the examples of the mark of a semiconductor wafer.

To allow the substrate position alignment device 1 to align the rotational angle positions of the semiconductor wafers 9 with the reference rotational angle position, the semiconductor wafers 9 are provided with marks indicating the crystal directions (crystal orientations) of the semiconductor wafers 9, respectively. As the marks, for example, there are a notch 90 which is formed as one notch of a V-shape in a plan view and is provided on the peripheral edge of the semiconductor wafer 9, as shown in FIG. 2A, and an orientation flat 91 which is a straight-line cut edge provided on the peripheral edge of the semiconductor wafer 9, as shown in FIG. 2B. Each of the semiconductor wafers 9 is rotated within an extended plane, and the rotation of the semiconductor wafer 9 is stopped at a time point when a mark detecting unit in which the reference rotational angle position is set, detects this mark. In this way, the rotational angle position of the semiconductor wafer 9 is aligned with the reference rotational angle position. As the mark detecting unit, for example, a transmission-type sensor, or a reflection-type sensor is used. Or, the semiconductor wafer 9 is rotated once within the horizontal plane, and the mark detecting unit detects this mark. From this, the amount of a misalignment of the initial rotational angle position of the semiconductor wafer 9 with respect to the reference rotational angle position, can be detected. Based on the amount of misalignment, each of the semiconductor wafers 9 is rotated so that the notch 90 or the orientation flat 91 of the semiconductor wafer 9 conforms to the reference rotational angle position. Hereinafter, the notch 90 will be exemplarily described as the mark. In a case where the substrates are different from the semiconductor wafers, the mark may indicate a predetermined posture (rotational angle) in a rotational direction of the substrate, which is taken in the specified treatment performed for the semiconductor wafer.
<Overall Configuration of Substrate Position Alignment Device>

Figure 3:
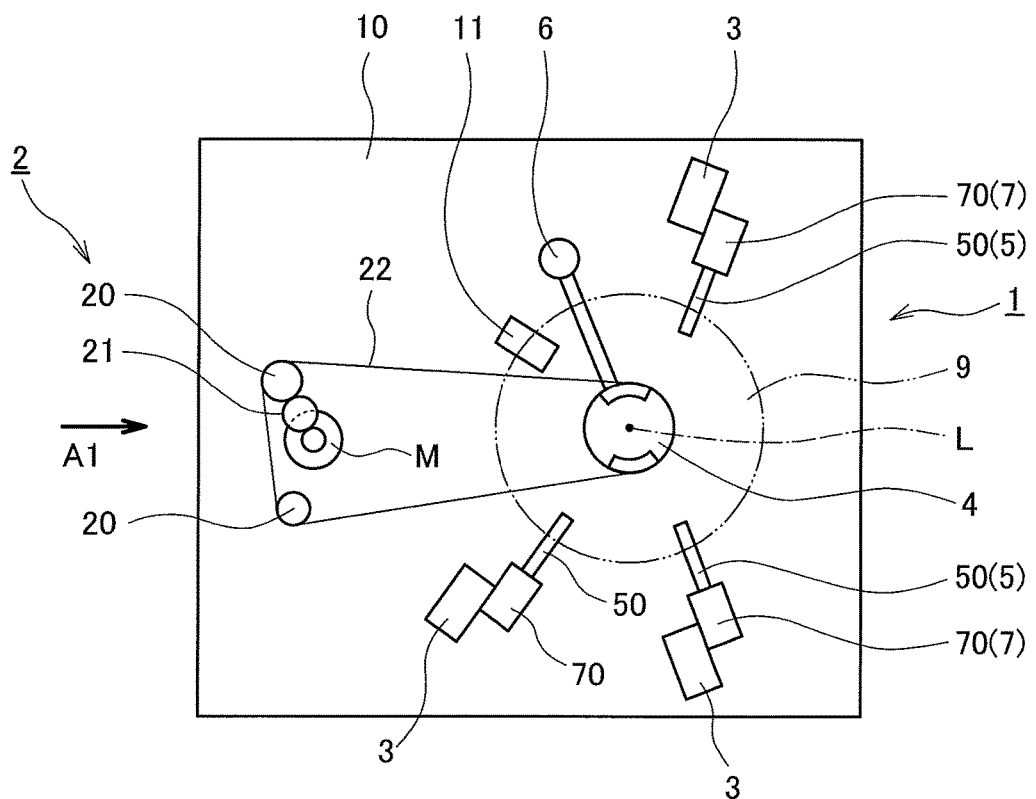
FIG. 3 is a plan view showing the overall configuration of the substrate position alignment device.

FIG. 3 is a plan view showing the overall configuration of the substrate position alignment device 1. As shown in FIG. 3, the substrate position alignment device 1 includes a base body 10 placed on a floor surface, three support column members 3 provided on the base body 10 to extend vertically in such a manner that the support column members 3 are spaced apart from each other in the circumferential direction of a virtual circle with a center which is an axis L extending vertically, a sensor pole 11 provided with a plurality of sensors arranged vertically to detect the notches 90 of the semiconductor wafers 9, respectively, five rotary tables 4 which are rotatable around the axis L and are arranged to be vertically spaced apart from each other, a support pole 6 located on the outer side of the rotary tables 4, and a rotation drive device 2 which synchronously rotates the five rotary tables 4. On each of the rotary tables 4, the semiconductor wafer 9 having been transferred by the hand 160 is placed. In a state in which each of the semiconductor wafers 9 is placed correctly on the corresponding rotary table 4, the center of the semiconductor wafer 9 conforms to the axis L. The support pole 6 is located on the outer side of the semiconductor wafers 9 placed on the rotary tables 4.

The rotation drive device 2 includes two rotary column members 20 provided on the outer side of the support column members 3 to extend vertically, a motor M which is one rotation drive source which rotates one of the two rotary column members 20 via an intermediate gear 21, and endless timing belts 22 wrapped around the two rotary column members 20 and the rotary tables 4. Five timing belts 22 are arranged vertically to correspond to the five rotary tables 5, respectively. The timing belts 22 constitute a "rotational driving force transmission mechanism" of the present invention. The motor M is constituted by, for example, a servo motor.

Figure 4:
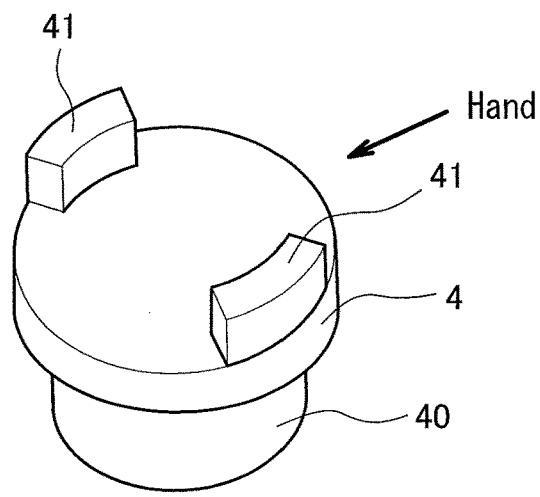
FIG. 4 is a perspective view of a rotary table.

FIG. 4 is a perspective view of the rotary table 4. As shown in FIG. 4, a receiver member 40 is provided below the rotary table 4. The rotary table 4 is rotatable with respect to the receiver member 40. A plurality of receiver projections 41 are provided on the upper surface of the rotary table 4. The semiconductor wafer 9 is placed on the upper surfaces of the receiver projections 41. In a state in which the semiconductor wafer 9 is placed on the upper surfaces of the receiver projections 41, a vertical gap is formed between the reverse surface of the semiconductor wafer 9 and the upper surface of the rotary table 4.

Figure 5:
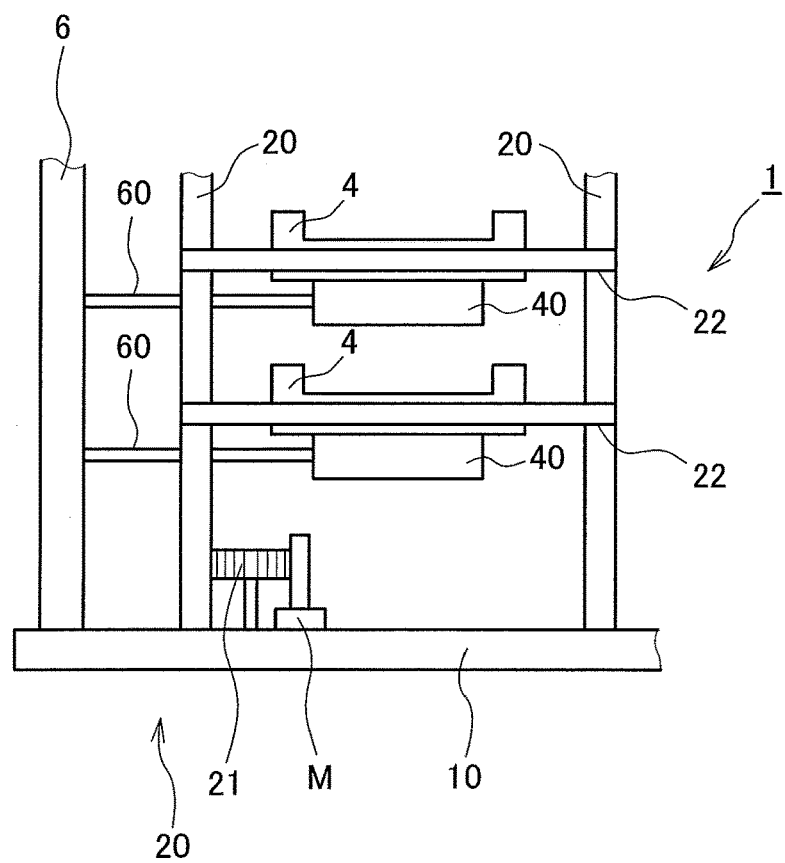
FIG. 5 is side view of a support pole when viewed from a direction of an arrow A1 of FIG. 3.

FIG. 5 is a side view of the support pole 6, when viewed from a direction of A1 of FIG. 3. For easier illustration, only the two rotary tables 4 from the bottom are shown in FIG. 5. However, as described above, the five rotary tables 4 are vertically arranged. As shown in FIG. 5, brackets 60 are provided to correspond to the five receiver members 40 at height positions, respectively, and protrude from the support pole 6 toward the receiver members 40, respectively. The receiver members 40 are mounted to the tip end portions of the brackets 60, respectively. The receiver members 40 and the rotary tables 4 are supported by the corresponding brackets 60 in a cantilever manner. Since each of the brackets 60 is located below the corresponding rotary table 4, the bracket 60 does not interfere with the semiconductor wafer 9 transferred onto the rotary table 4.

As shown in FIG. 3, since a rotational driving force can be transmitted to the rotary tables 4 via the timing belts 22, the motor M can be disposed at a spatial position that is distant from the rotary tables 4. In this way, a sufficient space can be obtained for the motor M. In other words, a design in the layout of the motor M becomes more flexible.

Figure 6:
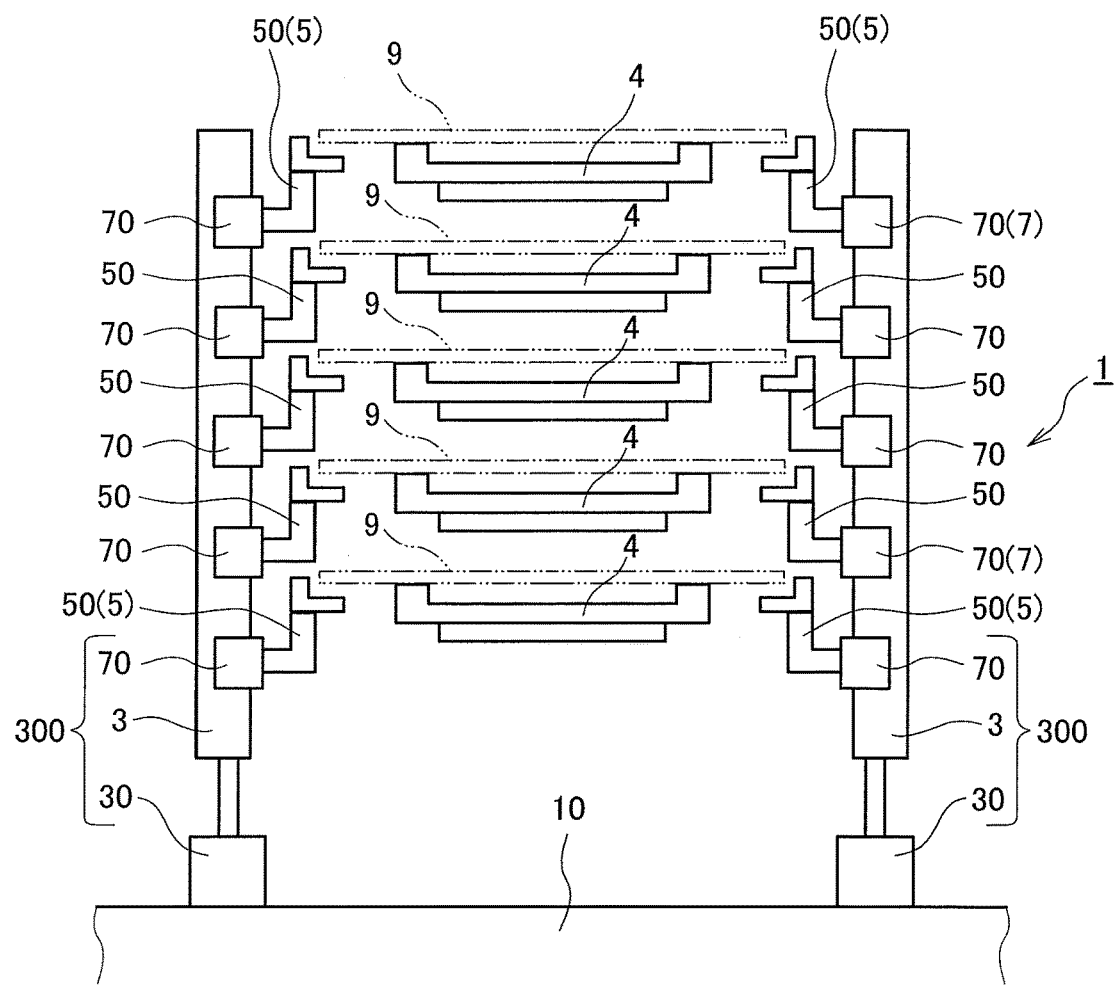
FIG. 6 is a side view of support column members and rotary tables.

FIG. 6 is a side view of the support column members 3 and the rotary tables 4. For the purpose of easier understanding of the description, two support column members 3 are shown in FIG. 6. As shown in FIG. 6, each of the support column members 3 includes support elements 50 which receive and support the peripheral edge portions of the semiconductor wafers 9 to be held on the rotary tables 4, respectively, and support element drive members 70 which horizontally move the support elements 50, respectively. The support element drive members 70 are constituted by, for example, air cylinders, respectively. More specifically, each of the support column members 3 includes five support elements 50 arranged vertically to correspond to the rotary tables 4 at height positions, respectively. The five support elements 50 are independently and horizontally driven by five support element drive members 70, respectively, which are arranged vertically to correspond to the rotary tables 4 at height positions, respectively. As described above, the three support column members 3 are provided. Therefore, one support element set 5 includes the three support elements 50 located at the same height position, while one support element set drive member unit 7 includes three support element drive members 70 located at the same height position. At the lower end portion of each of the support column members 3, an up-down device 30 is provided. Three up-down devices 30 are configured to synchronously move up and down the three support column members 3, the five support element sets 5, and the five support element set drive member units 7. The up-down device 30 may be, for example, a motor containing an air cylinder or a rack mechanism. However, the up-down device 30 is not limited to these. An up-down mechanism 300 of the present invention includes the three support column members 3, the support element set drive member units 7, and the up-down devices 30. However, the up-down mechanism 300 is not limited to this. For example, the up-down mechanism 300 may be configured in such a manner that the three support column members 3 are fixed and provided with up-down devices, respectively, each of which moves up and down the corresponding five support element drive members 70 in synchronization with each other. The five support elements 50 are independently and horizontally driven by the support element drive members 70, respectively, and are mounted to each of the support column members 3. Therefore, the five support elements 50 move and up and down together with the support column member 3. In other words, each of the support elements 50 is movable independently and horizontally but is unable to independently move up and down.

Figure 7A:
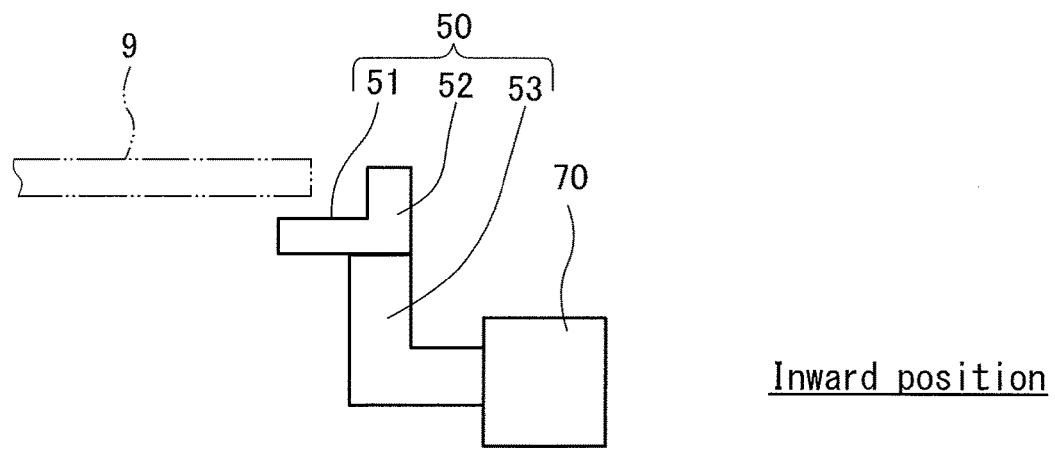
FIGS. 7A and 7B are enlarged views of a support element.
Figure 7B:
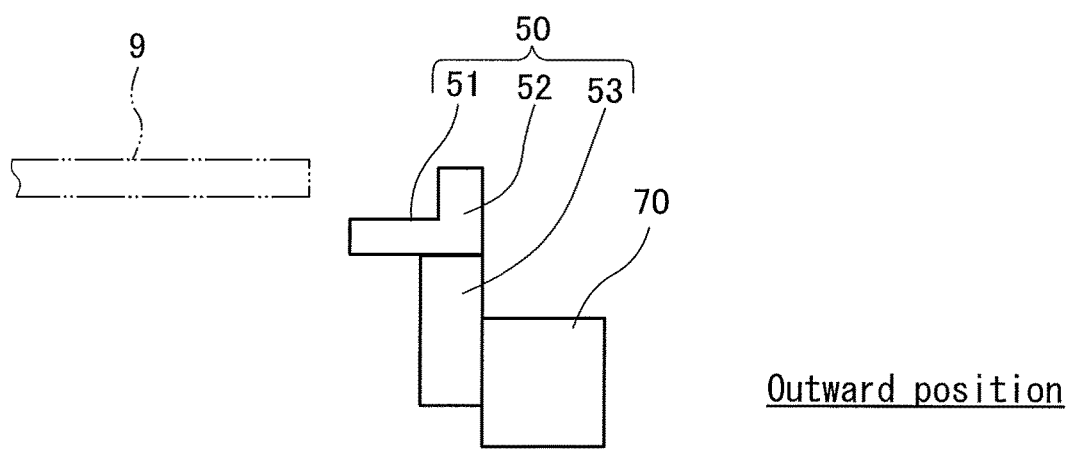

FIGS. 7A and 7B are enlarged views, each of which shows the support element 50 which is driven by the separate support element drive member 70. As shown in FIGS. 7A and 7B, the support element 50 includes a receiver portion 51 which has a horizontal upper surface to receive the lower surface of the peripheral edge portion of the semiconductor wafer 9, a longitudinal wall 52 which extends vertically upward from the outer end portion of the receiver portion 51 to suppress a misalignment of the semiconductor wafer 9 which is horizontally outward, and an element body 53 fitted to the support element drive member 70 in such a manner that the element body 53 is horizontally movable into and out of the support element drive member 70, the receiver portion 51, the longitudinal wall 52, and the element body 53 being integrated with each other. The support element 50 is dependently driven by the support element drive member 70 between an inward position at which the tip end portion of the receiver portion 51 is located inward relative to the outer periphery of the semiconductor wafer 9 as shown in FIG. 7A and an outward position at which the tip end portion of the receiver portion 51 is located outward relative to the outer periphery of the semiconductor wafer 9 as shown in FIG. 7B.

FIGS. 8A and 8B are enlarged views each showing a vertical positional relationship between the support columnar members 3 and the support elements 50 which are moved up and down by the up-down devices 30, and the rotary table 4. In FIGS. 8A and 8B, the lowermost support elements 50 are shown. The same applies to vertical positional relationships between other support elements 50 and the corresponding rotary tables 4. As shown in FIGS. 8A and 8B, the up-down devices 30 move up and down the support columnar members 3 in such a manner that the support elements 50 are movable between low positions (see FIG. 8A) at which the upper surfaces of the receiver portions 51 are located below the lower surface of the semiconductor wafer 9 held on the rotary table 4 corresponding to the support elements 50, and high positions (see FIG. 8B) at which the upper surfaces of the receiver portions 51 are located above the lower surface of the semiconductor wafer 9 held on the rotary table 4 corresponding to the support elements 50. Therefore, when the up-down devices 30 move up the support elements 50 to the high positions, respectively, in a state in which the support element drive members 70 set the support elements 50 at the inward positions, respectively, the support elements 50 lift-up the semiconductor wafer 9 held on the corresponding rotary table 4, from the rotary table 4, as shown in FIG. 8B. Thereby, the semiconductor wafer 9 does not rotate even when the rotary table 4 is rotating. On the other hand, in a state in which the support element drive members 70 set the corresponding support elements 50 at the outward positions, respectively, at which the tip end portions of the receiver portions 51 are located outward relative to the outer periphery of the semiconductor wafer 9, the support elements 50 do not lift-up the corresponding semiconductor wafer 9, from the rotary table 4, even when the up-down devices 30 move up the support elements 50 to the high positions, respectively. The semiconductor wafer 9 continues to be placed on the rotary table 4. In other words, by synchronously driving the support element drive members 70 and the up-down devices 30, the state in which arbitrary support elements 50 lift-up the semiconductor wafer 9 from the corresponding rotary table 4 or the state in which arbitrary support elements 50 do not lift-up the semiconductor wafer 9 from the corresponding rotary table 4, can selectively take place, when the support column members 3 are moved up.

Figure 9:
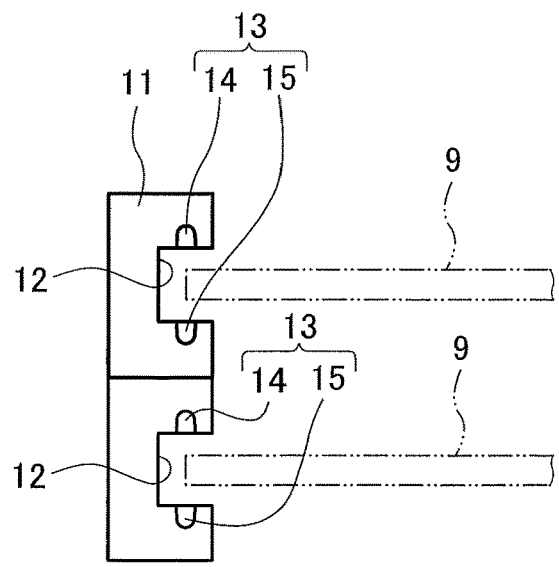
FIG. 9 is an enlarged side view of a sensor pole.

FIG. 9 is an enlarged side view of the sensor pole 11. As shown in FIG. 9, the side surface of the sensor pole 11 is formed with five recesses 12 having openings, respectively, into which the peripheral edge portions of the semiconductor wafers 9 are fitted in such a manner that the five recesses 12 are arranged vertically to correspond to the semiconductor wafers 9 at height positions, respectively. The openings of the recesses 12 face the axis L so that the semiconductor wafers 9 transferred onto the rotary tables 4 by the hand 160 can be moved into the recesses 12, respectively. The recesses 12 are provided with sensors 13 which detect the notches 90 (see FIG. 2A) of the semiconductor wafer 9, respectively. Each of the sensors 13 is constituted by, for example, a transmission-type sensor including a light emitting element 14 and a light receiving element 15 which are located on an upper side and a lower side, respectively, and between which the peripheral portion of the semiconductor wafer 9 is interposed. When the light emitted from the light emitting element 14 reaches the light receiving element 15 while the semiconductor wafer 9 is rotating, it can be detected that the notch 90 has passed through the sensor 13. A position at which the notch 90 is detected by the sensor 13 is the rotational angle position of the notch 90. More specifically, by detecting the rotational angle of the rotary table 4 which is formed from a state in which the semiconductor wafer 9 is initially placed on the rotary table 4 until the sensor 13 detects the notch 90, the amount of a misalignment angle of the semiconductor wafer 9 placed initially, from the reference rotational angle position, can be detected. The sensor 13 constitutes a "mark position detecting unit" of the present invention. The vertical position relationship between the light emitting element 14 and the light receiving element 15, shown in FIG. 9, may be reversed. Further, the sensor 13 may be configured as a reflection-type sensor including a light emitting section and a light receiving section on one side, and a reflection plate on the other side. The vertical length of the recess 12 is set so that the semiconductor wafer 9 does not contact the light emitting element 14 or the light receiving element 15, while the semiconductor wafer 9 is moved up and down between the high position and the low position.

Figure 10:
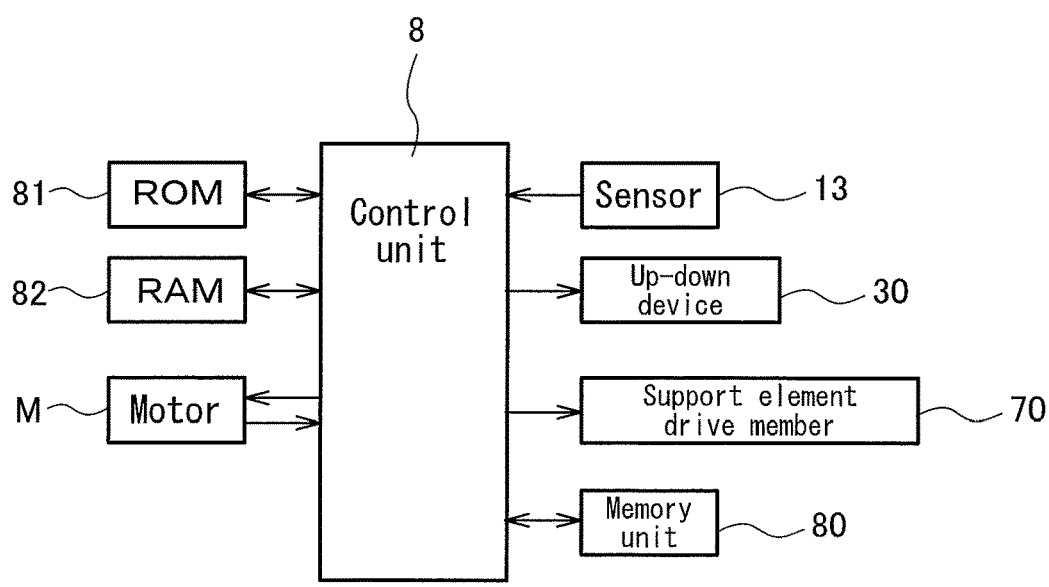
FIG. 10 is a block diagram showing constituents provided in the vicinity of a control unit.

FIG. 10 is a block diagram showing the constituents which are in the vicinity of a control unit 8 which performs the control operation of the substrate position alignment device 1. Although the control unit 8 is configured as, for example, a single CPU, it may include a combination of a plurality of CPUs. The control unit 8 is disposed within, for example, the base body 10. The control unit 8 may include a combination of a CPU and an ASIC (Application Specific Integrated Circuit). The sensors 13, the up-down devices 30, the support element drive members 70, the motor M, a memory unit 80 which is a memory for storing therein the rotational angle positions of the semiconductor wafers 9, an ROM 81 which contains operation programs therein, and an RAM 82 which serves as a work memory for temporarily storing information therein, are connected to the control unit 8. Identification numbers are assigned to the five rotary tables 4, respectively, and are stored in, for example the RAM 82. The control unit 8 activates the motor M to rotate all of the rotary tables 4 once, and detects the rotational angle of the rotary table 4, which is formed from a state in which the semiconductor wafer 9 is initially placed on the rotary table 4 to the reference rotational angle position at which the sensor 13 detects the notch 90, for all of the semiconductor wafers 9. The rotational angle is detected by a rotational angle sensor such as a rotary encoder attached to the main shaft of the motor M, and the detected value is input to the control unit 8. Then, the control unit 8 stores in the memory unit 80, the value of the amount of the misalignment angle of the semiconductor wafer 9 placed initially on the rotary table 4, from the reference rotational angle position in such a manner that the value corresponds to each of the rotary tables 4. This value is used in the substrate position alignment operation which will be described later.

<Operation of Substrate Position Alignment Device>

Firstly, with reference to FIG. 6, and FIGS. 8A and 8B, a substrate receiving operation will be described. As shown in FIG. 8B, the control unit 8 activates the up-down devices 30 to move all of the support element set drive member units 7 together to the high positions, and causes the support element set drive member units 7 to move all of the support element sets 5 to the inward positions, respectively (see FIG. 8B). Hereinafter, this operation will be referred to as the substrate receiving operation. In a state in which the substrate receiving operation is completed, the transfer robot 130 moves the hand 160 into the substrate position alignment device 1 to transfer the plurality of (in the present embodiment, five) semiconductor wafers 9 to the plurality of (in the present embodiment, five) support element sets 5 and place the semiconductor wafers 9 thereon. After that, as shown in FIG. 6, the control unit 8 activates the up-down devices 30 to move all of the support element set drive member units 7 together to the low positions, respectively, and causes the plurality of semiconductor wafers 9 to be held on the plurality of (in the present embodiment, five) rotary tables 4, respectively. Hereinafter, this operation will be referred to as a substrate holding operation.

Next, the position alignment will be described with reference to FIGS. 6 and 11 to 13. In an initial state of FIG. 6, in which the semiconductor wafers 9 are placed on all of the rotary tables 4, respectively, in the above-described manner, the rotational angle positions of the semiconductor wafers 9 are non-uniform. In other words, the rotational angle positions of the semiconductor wafers 9 are not aligned with the reference rotational angle position yet. In the substrate position alignment device 1 of the present embodiment, the rotational angle position of the semiconductor wafer 9 held on the rotation table 4 with an arbitrary identification number can be aligned with the reference rotational angle position. Aligning the rotational angle position of the semiconductor wafer 9 with the reference rotational angle position will be referred to as "position alignment". Hereinafter, the position alignment operations for sequentially aligning the rotational angle positions of the semiconductor wafers 9 with the reference rotational angle position, starting from the uppermost semiconductor wafer 9 of FIG. 6, will be described. In the state of FIG. 6, the control unit 8 activates the motor M to rotate all of the rotary tables 4 once, and causes all of the sensors 13 to detect the notches 90 of all of the semiconductor wafers 9, respectively. The control unit 8 detects the rotational angle position of the notch 90, based on the rotational angle of the motor M which is detected by the rotational angle sensor at a time point when each of the sensors 13 detects the notch 90. After that, the control unit 8 stops all of the rotary tables 4, calculates the amount of a misalignment between the reference rotational angle position and the rotational angle position at which the notch 90 is detected, for each of all of the semiconductor wafers 9, and stores in the memory unit 80 this angular misalignment amount for each of the identification numbers of the rotary tables 4 corresponding to the semiconductor wafers 9. This operation will be referred to as "mark position detecting operation." Then, the control unit 8 reads an angular misalignment amount between the reference rotational angle position and the initial rotational angle position of the uppermost semiconductor wafer 9, from the memory unit 80, and rotates all of the rotary tables 4 by this angular misalignment amount. In this way, only the rotational angle position of the uppermost semiconductor wafer 9 is aligned with the reference rotational angle position. In other words, "position alignment" for the uppermost semiconductor wafer 9 is completed.

Figure 11:
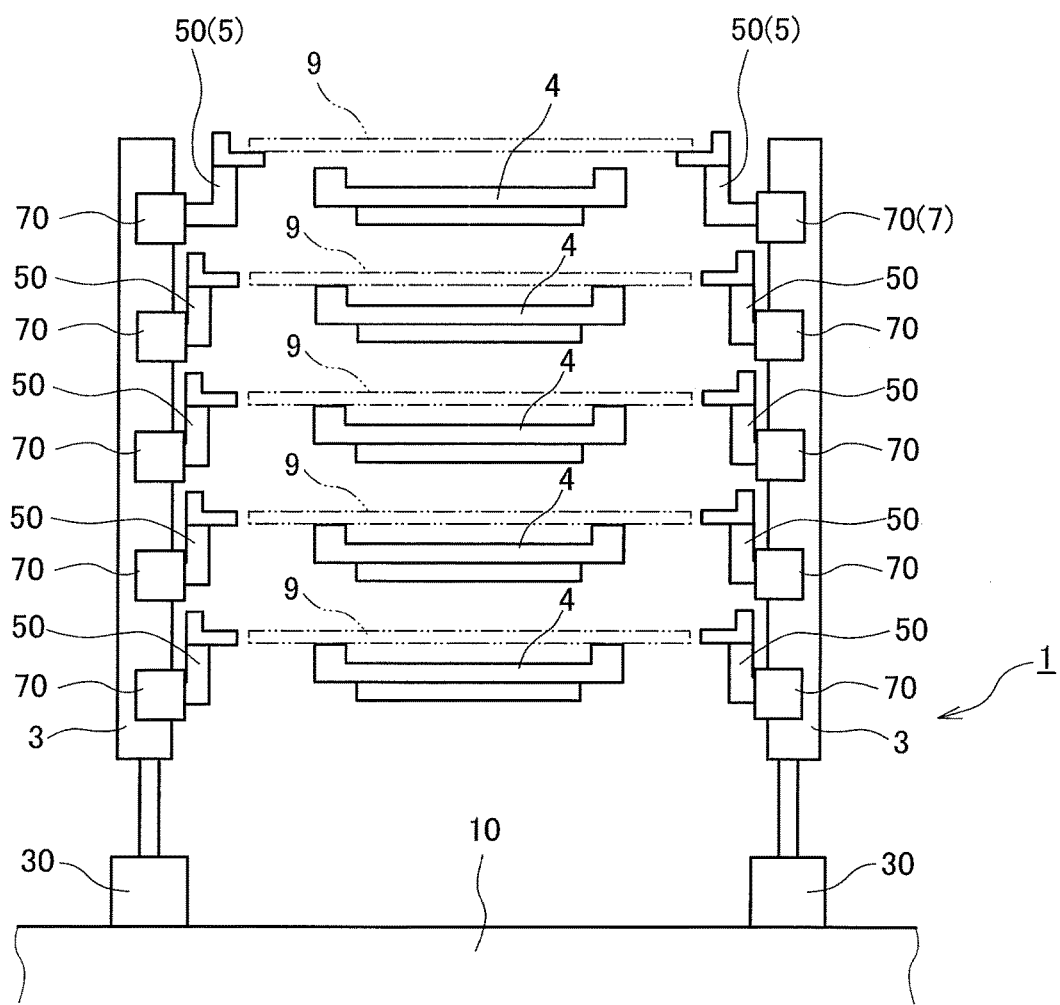
FIG. 11 is a side view of the support column members and the rotary tables, showing a substrate lift-up operation.

Then, as shown in FIG. 11, the control unit 8 activates the support element set drive member units 7 to move only the uppermost support element set 5 to the inward position, and other (remaining) support element sets 5 to the outward positions, respectively. In this state, the control unit 8 activates the up-down devices 30 to move all of the support element sets 5 to the high positions, respectively. Since only the uppermost support element set 5 is set at the inward position, and other support element sets 5 are set at the outward positions, respectively, only the uppermost semiconductor wafer 9 whose rotational angle position has been aligned with the reference rotational angle position, is lifted-up from the rotary table 4, while other (the remaining) semiconductor wafers 9 continue to be placed on the rotary tables 4, respectively. This operation will be referred to as "substrate lift-up operation".

Figure 12:
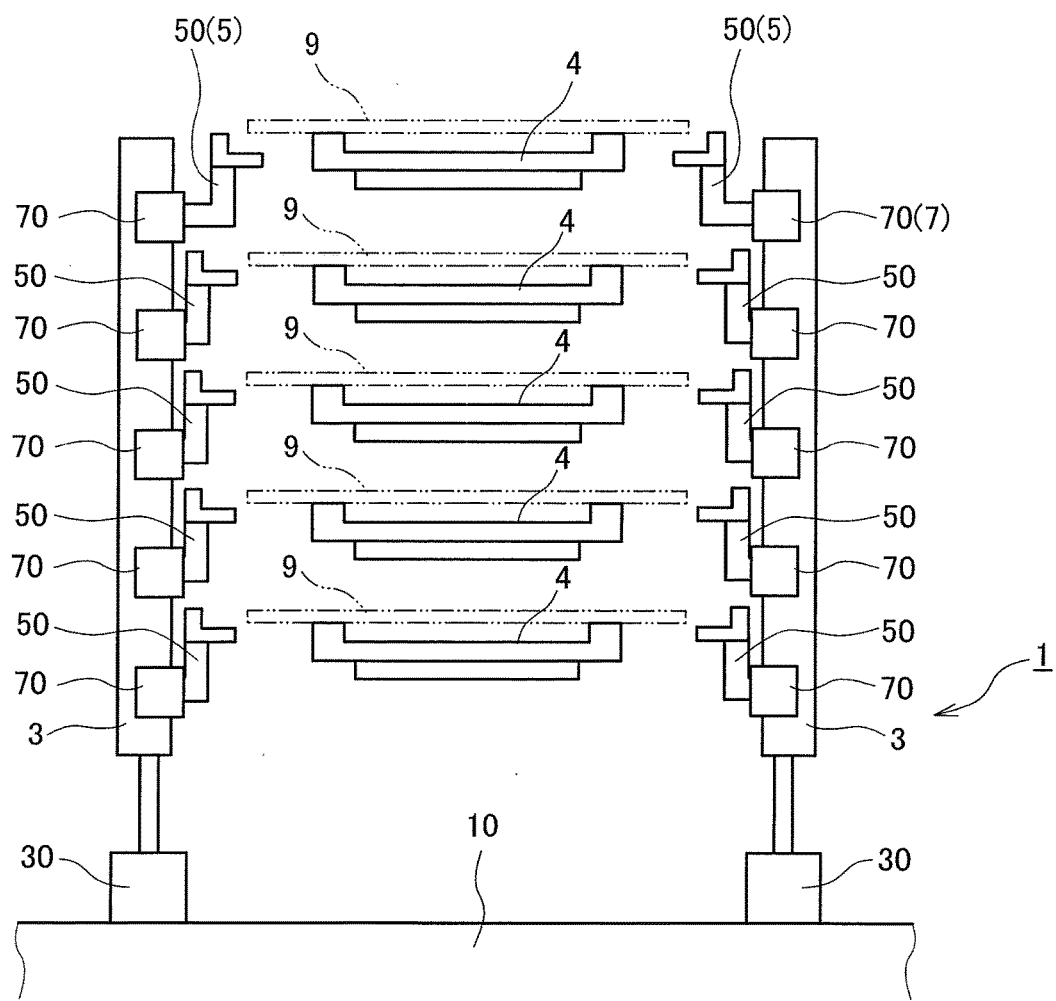
FIG. 12 is a side view of the support column members and the rotary tables, showing a substrate holding operation.

Then, while maintaining a state in which all of the support element sets 5 are set at the high positions, respectively, the control unit 8 reads the angular misalignment amount of the second second semiconductor wafer 9 from the top, from the memory unit 80. The control unit 8 calculates a rotational angle amount required to align the rotational angle position of the semiconductor wafer 9 held on the second rotary table 4 from the top, with the reference rotational angle position, by performing addition or subtraction on the rotation amount of the uppermost rotary table 4 which was rotated previously and the angular misalignment amount of the second semiconductor wafer 9 from the top. The control unit 8 activates the motor M to rotate all of the rotary tables 4 by the calculated rotational angle amount, to align the rotational angle position of the semiconductor wafer 9 held on the second rotary table 4 from the top, with the reference rotational angle position, in the above-described procedure. In brief, the control unit 8 performs the "position alignment" again. Since the uppermost semiconductor wafer 9 has been lifted-up by the uppermost support element set 5, the uppermost semiconductor wafer 9 does not rotate even when all of the rotary tables 4 are rotating. After the rotational angle position of the second semiconductor wafer 9 from the top has been aligned with the reference rotational angle position, the control unit 8 stops all of the rotary tables 4. As shown in FIG. 12, in a state in which all of the rotary tables 4 are stopped, the control unit 8 activates the up-down devices 30 to move down the three support column members 3 to thereby move all of the support element sets 5 to the low positions, respectively, so that the uppermost semiconductor wafer 9 is temporarily placed on the uppermost rotary table 4. This operation will be referred to as a "temporary substrate holding operation".

Figure 13:
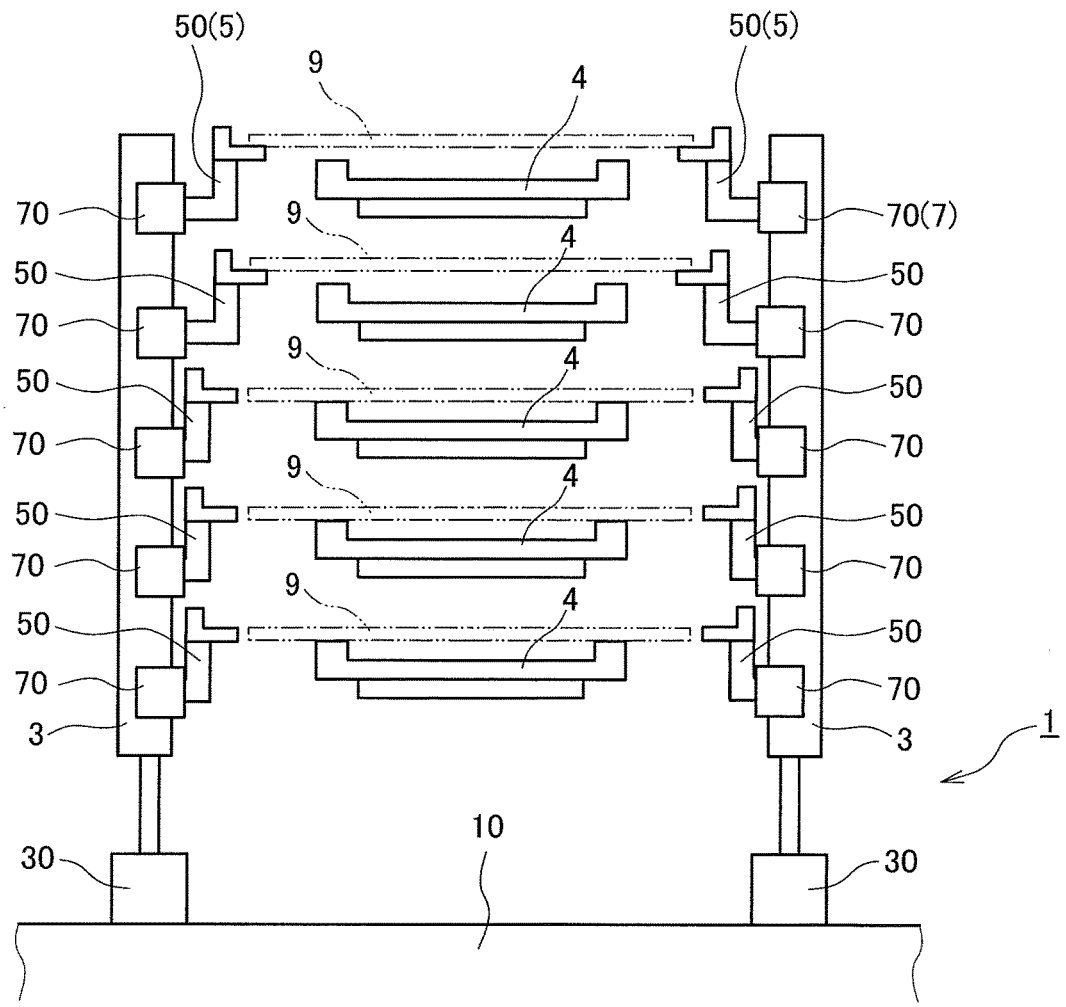
FIG. 13 is a side view of the support column members and the rotary tables, showing the substrate lift-up operation performed again.

In this state, the control unit 8 activates the second support element set drive member unit 7 from the top to move the second support element set 5 from the top to the inward position. The uppermost support element set 5 remains at the inward position. The support element sets 5 which are other than the uppermost support element set 5 and the second support element set 5 from the top, remain at the outward positions, respectively. Then, as shown in FIG. 13, the control unit 8 activates the up-down devices 30 to move up the three support column members 3, to move all of the support element sets 5 to the high positions, respectively. The uppermost semiconductor wafer 9, whose rotational angle position has been aligned with the reference rotational angle position, and the second semiconductor wafer 9 from the top, whose rotational angle position has been aligned with the reference rotational angle position, are lifted-up to the high positions, respectively. In other words, the control unit 8 performs the "substrate lift-up operation" again.

Thereafter, by repeating the same procedure, the control unit 8 aligns the rotational angle positions of all of the semiconductor wafers 9 with the reference rotational angle position. Specifically, the control unit 8 repeatedly performs the "position alignment" for a specified semiconductor wafer, the "substrate lift-up operation" for the specified semiconductor wafer, the "position alignment" for a next semiconductor wafer, the "temporary substrate holding operation" for the specified semiconductor wafer, and the "substrate lift-up operation" for the specified semiconductor wafer and the next semiconductor wafer, until the rotational angle position alignment operation for the last semiconductor wafer is completed. After that, the transfer robot 130 causes the hand 160 to take all of the semiconductor wafers 9 out of the substrate position alignment device 1.

By selecting an optimal order of the "position alignment" according to the rotational angle positions of the plurality of semiconductor wafers 9, the "position alignment" for the plurality of semiconductor wafers 9 can be performed in a short time.

Although in the above-described embodiment, the procedure for sequentially performing the "position alignment" operations for the plurality of semiconductor wafers 9 held at vertical positions, starting from the uppermost semiconductor wafer 9, has been described, the "position alignment" operations for the plurality of semiconductor wafers 9 may be performed in a desired order. This desired order may be manually input by an operator or decided in such a manner that the control unit 8 generates random numbers corresponding to the identification numbers, respectively.

(Embodiment 2)

Figure 14:
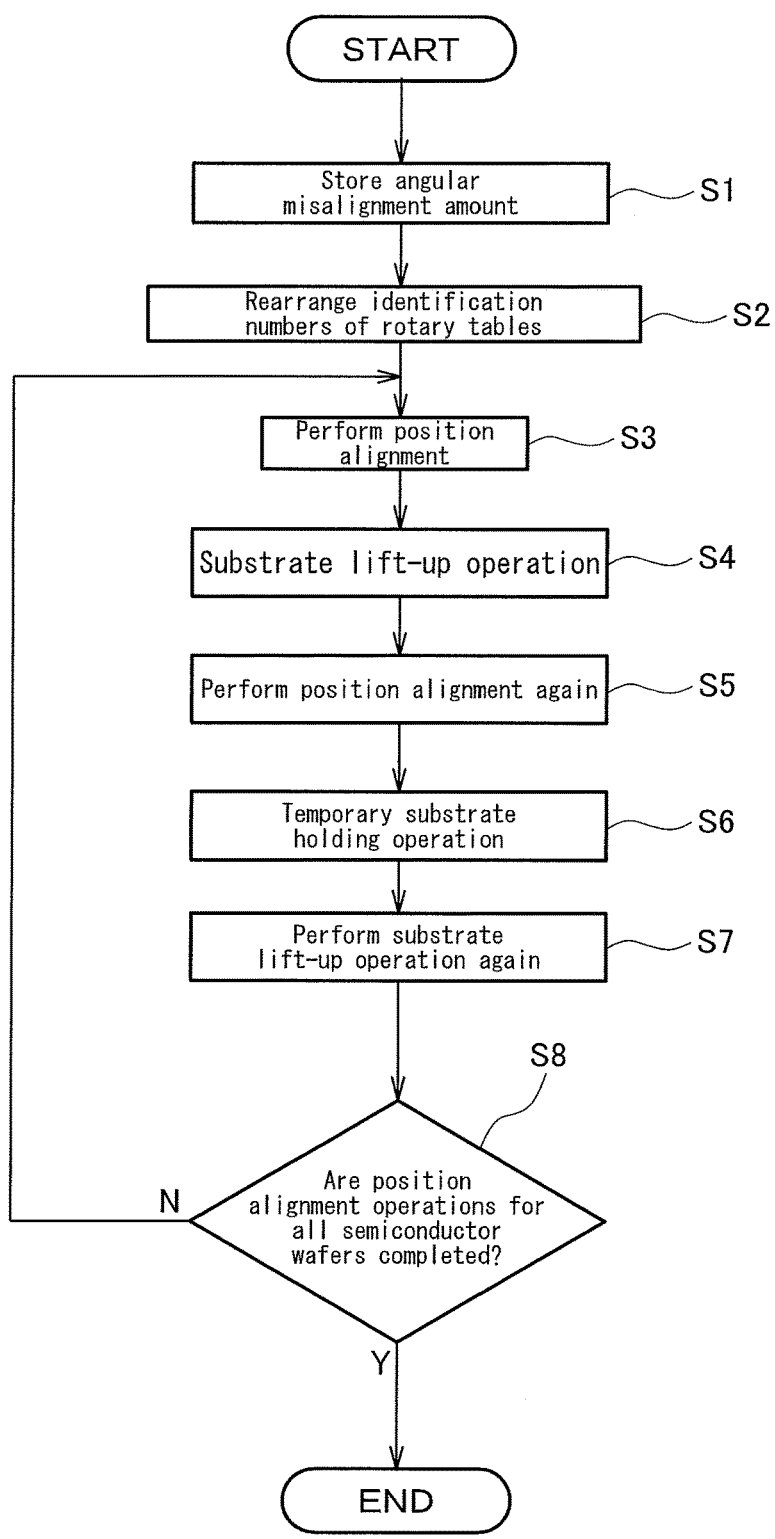
FIG. 14 is a flowchart showing the operation of a substrate position alignment device according to Embodiment 2.

In the substrate position alignment device 1 according to Embodiment 2 of the present invention, the rotational angle positions of the plurality of semiconductor wafers 9 can be sequentially aligned with the reference rotational angle position, starting from the semiconductor wafer 9 with a smallest angular misalignment amount from the reference rotational angle position. This makes it possible to complete the position alignment operations for all of the semiconductor wafers 9, in a shortest time. Hereinafter, this operation will be described with reference to the flowchart of FIG. 14.

The control unit 8 activates the motor M to rotate all of the rotary tables 4 once, and stores in the memory unit 80, a value indicating the angular misalignment amount of the initial rotational angle position of each of all of the semiconductor wafers 9, from the reference rotational angle position, for each of the identification numbers of the rotary tables 4 (step S1). In brief, the control unit 8 performs the "mark position detecting operation". Then, the control unit 8 detects the rotary table 4 with the identification number on which the semiconductor wafer 9 whose rotational angle position has the smallest angular misalignment amount, from among the angular misalignment amounts of the rotational angle positions, which are stored in the memory unit 80, and then re-arranges the identification numbers of the rotary tables 4 in order of increasing the angular misalignment amount of the rotational angle position (step S2).

The control unit 8 reads the smallest angular misalignment amount from the memory unit 80, and rotates all of the rotary tables 4 by this angular misalignment amount. Thereby, only the rotational angle position of the semiconductor wafer 9 whose rotational angle position has the smallest angular misalignment amount is aligned with the reference rotational angle position, namely, the "position alignment" (step S3).

Then, the control unit 8 activates the support element set drive member units 7 to move only the support element set 5 corresponding to the semiconductor wafer 9 whose rotational angle position has the smallest angular misalignment amount, to the inward position, and move other (the remaining) support element sets 5 to the outward positions, respectively. In this state, the control unit 8 activates the up-down devices 30 to move all of the support element sets 5 to the high positions, respectively. In brief, the control unit 8 performs the "substrate lift-up operation" for the semiconductor wafer 9 whose rotational angle position has the smallest angular misalignment amount (step S4).

Then, the control unit 8 reads a second smallest angular misalignment amount from the memory unit 80, and activates the motor M to rotate all of the rotary tables 4 by this angular misalignment amount, while maintaining the state in which all of the support element sets 5 are set at the high positions, respectively. In other words, the control unit 8 performs the "position alignment" again (step S5). Since the semiconductor wafer 9 whose rotational angle position has been firstly aligned with the reference rotational angle position continues to be lifted-up by the corresponding support element set 5, this semiconductor wafer 9 does not rotate even when all of the rotary tables 4 are rotating. After the control unit 8 has aligned the rotational angle position of the semiconductor wafer 9 whose rotational angle position has the second smallest angular misalignment amount, with the reference rotational angle position, the control unit 8 stops all of the rotary tables 4. In a state in which all of the rotary tables 4 are stopped, the control unit 8 activates the up-down devices 30 to move all of the support element sets 5 to the low positions, respectively, and temporarily places the semiconductor wafer 9 whose rotational angle position has been firstly aligned with the reference rotational angle position, on the corresponding rotary table 4. In brief, the control unit 8 performs the "temporary substrate holding operation" (step S6).

In this state, the control unit 8 activates the support element set drive member unit 7 corresponding to the semiconductor wafer 9 whose rotational angle position has the second smallest angular misalignment amount, to move the support element set 5 corresponding to this semiconductor wafer 9, to the inward position. Then, the control unit 8 activates the up-down devices 30 to move all of the support element sets 5 to the high positions, respectively, and lifts-up the semiconductor wafer 9 whose rotational angle position has been firstly aligned with the reference rotational angle position, and the semiconductor wafer 9 whose rotational angle position has been secondly aligned with the reference rotational angle position, to the high positions, respectively. In brief, the control unit 8 performs the "substrate lift-up operation" again (step S7). The control unit 8 performs the above-described operations for all of the semiconductor wafers 9 (step 8). After the control unit 8 has aligned the rotational angle positions of all of the semiconductor wafers 9 with the reference rotational angle position, the hand 160 takes all of the semiconductor wafers 9 out of the substrate position alignment device 1.

In the substrate position alignment device 1 according to the present embodiment, the control unit 8 is capable of performing the control operations to sequentially align the rotational angle positions of the semiconductor wafers 9 with the reference rotational angle position, starting from the semiconductor wafer 9 whose angular misalignment amount from the reference rotational angle position is smallest. Thereby, the position alignment operations for all of the semiconductor wafers 9 can be completed in a shortest time, and performed automatically without intervention of an operator. It should be noted that the rotational angle position of the semiconductor wafer 9 can be aligned with the reference rotational angle position by setting the sensor 13 in the reference rotational angle position and stopping the rotation of the semiconductor wafer 9 at a time point when the sensor 13 detects the notch 90. In this case, it is not necessary to store the angular misalignment amount of the semiconductor wafer 9 in the memory unit 80. Further, instead of placing the plurality of semiconductor wafers 9 on the support element sets 5 set at the high positions and the inward positions when the hand 160 transfers the plurality of semiconductor wafers 9, the support element sets 5 may be set at the outward positions, respectively and the semiconductor wafers 9 may be placed on the rotary tables 4, respectively.

<Modified Example of Support Element>

Figure 15:
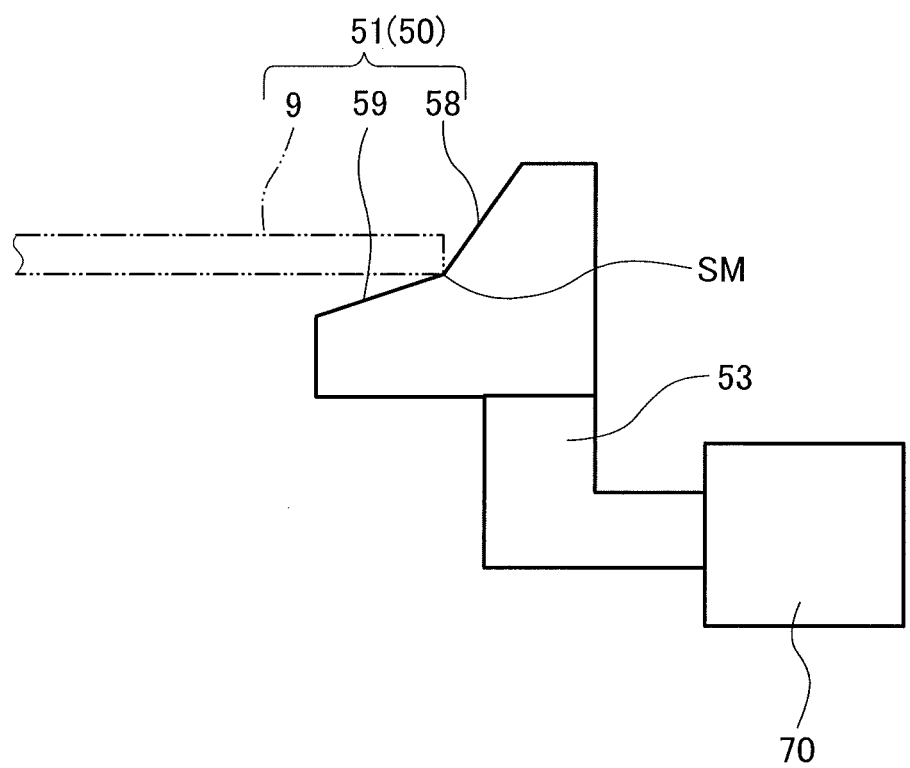
FIG. 15 is a view showing the modified example of the support element.

As described above, as shown in FIG. 7A, the lower surface of the peripheral edge portion of the semiconductor wafer 9 is supported on the receiver portion 51 of the support element 50. Alternatively, as shown in FIG. 15, the inner surface of the receiver portion 51 may have a first inclined surface 58 and a second inclined surface 59 with a gradient which is smaller than that of the first inclined surface 58 in such a manner that the first inclined surface 58 and the second inclined surface 59 are continuous with each other, and the peripheral edge portion of the semiconductor wafer 9 may be supported at a boundary SM between the first inclined surface 58 and the second inclined surface 59. In accordance with the configuration of FIG. 15, when the semiconductor wafer 9 is held on the receiver portion 51, the semiconductor wafer 9 slides on the first inclined surface 58 and is placed on the boundary SM. Thereby, the horizontal position and horizontal posture of the semiconductor wafer 9 are corrected, and hence the semiconductor wafer 9 is stably held on the receiver portion 51. Since the receiver portion 51 and the semiconductor wafer 9 linearly contact each other, an area of a portion of the receiver portion 51 and a portion of the semiconductor wafer 9, the portions contacting each other, is small. This makes it reduce foreign matters adhering to the semiconductor wafer 9.

INDUSTRIAL APPLICABILITY

The present invention is effectively used in a substrate position alignment device which aligns the rotational angle positions of a plurality of substrates with a reference rotational angle position, and a control method of this substrate position alignment device.

REFERENCE SIGNS LIST 1 substrate position alignment device
2 rotation drive device
3 support column member
4 rotary table
5 support element set
7 support element set drive member unit
8 control unit
9 semiconductor wafer
300 up-down device
50 support element
70 support element drive member
80 memory unit
300 up-down mechanism

The invention claimed is:

1. A substrate position alignment device comprising:
a plurality of rotary tables disposed to be vertically spaced apart from each other to hold a plurality of substrates in such a manner that the plurality of substrates are placed to extend horizontally and arranged to be vertically spaced apart from each other, the plurality of rotary tables being rotatable around an axis extending vertically;
a rotation drive device which synchronously rotates the plurality of rotary tables;
a plurality of mark position detecting units which detect rotational angle positions of marks of the plurality of substrates which are held on the plurality of rotary tables and rotated by the plurality of rotary tables, respectively;
a plurality of support element sets configured to support peripheral edge portions of the plurality of substrates to be held on the plurality of rotary tables, respectively; a plurality of support element set drive member units configured to independently support the plurality of support element sets, respectively, and to independently move the plurality of support element sets, respectively, between inward positions at which the plurality of support element sets are located inward relative to outer peripheries of the plurality of substrates, respectively, and outward positions at which the plurality of support element sets are located outward relative to the outer peripheries of the plurality of substrates, respectively; and
an up-down mechanism which moves up and down the plurality of support element set drive member units together, between high positions and low positions in a predetermined height range,
wherein the plurality of support element sets disposed at the high positions are set to be higher than the plurality of substrates held on the plurality of rotary tables corresponding to the plurality of support element sets, respectively, and the plurality of support element sets disposed at the low positions are set to be lower than the plurality of substrates held on the plurality of rotary tables corresponding to the plurality of support element sets, respectively, and
wherein the rotation drive device, the plurality of support element set drive member units, and the up-down mechanism are operated based on the rotational angle positions of the marks of the plurality of substrates which are detected by the plurality of mark position detecting units, respectively, to align the marks of the plurality of substrates with a reference rotational angle position.

2. The substrate position alignment device according to claim 1, further comprising:
a control unit which receives as inputs the rotational angle positions of the marks of the plurality of substrates which are detected by the plurality of mark position detecting units, respectively, and controls the rotation drive device, the plurality of support element set drive member units, and the up-down mechanism; and
a memory unit,
wherein the control unit is configured to perform:
a mark position detecting operation in which the control unit causes the rotation drive device to synchronously rotate the plurality of rotary tables and causes the memory unit to store the rotational angle positions of the marks of the plurality of substrates held on the plurality of rotary tables, respectively, the rotational angle positions being detected by the plurality of mark position detecting units, respectively, and a sequential substrate position alignment operation in such a manner that the plurality of substrates sequentially go through the sequential substrate position alignment operation, the sequential substrate position alignment operation including:

position alignment performed in such a manner that the rotation drive device synchronously rotates the plurality of rotary tables to align the rotational angle position of the mark of a specified substrate of the plurality of substrates with the reference rotational angle position, using the rotational angle position of the mark of the specified substrate which is stored in the memory unit, and substrate lift-up performed in such a manner that the support element set drive member unit corresponding to the support element set corresponding to the specified substrate for which the position alignment is completed, moves the support element set to the inward position, the support element set drive member units corresponding to the support element sets corresponding to the substrates for which the position alignment is not completed, move the support element sets to the outward positions, respectively, and then the up-down mechanism moves the plurality of support element set drive member units together to the high positions, respectively, to lift-up only the substrate for which the position alignment is completed, from the rotary table.

3. The substrate position alignment device according to claim 2, wherein the control unit is configured to, after previous substrate lift-up has been performed, activate the up-down mechanism to move the plurality of support element set drive member units together to the low positions, respectively, and then perform subsequent substrate-lift up in such a manner that the support element set drive member unit and the up-down mechanism lift-up only the substrate for which the position alignment is completed, from the rotary table.

4. The substrate position alignment device according to claim 2, wherein the control unit is configured to perform: a substrate receiving operation in which the up-down mechanism moves the plurality of support element set drive member units to the high positions, respectively, and the plurality of support element set drive member units move the plurality of support element sets to the inward positions, respectively, and a substrate holding operation in which after the plurality of substrates are transferred to and placed on the plurality of support element sets which have completed the substrate receiving operation, the up-down mechanism moves the plurality of support element set drive member units to the low positions, respectively, to cause the plurality of substrates to be held on the plurality of rotary tables, respectively, and wherein the control unit is configured to perform the mark position detecting operation and the sequential substrate position alignment operation, after the substrate holding operation.

5. The substrate position alignment device according to claims 2, wherein the control unit is configured to calculate an order of the position alignment for the plurality of substrates, in which a rotation amount of the rotatory tables which is required to perform the position alignment for all of the plurality of substrates is smallest, based on the rotational angle positions of the marks of the plurality of substrates which are stored in the memory unit, and to perform the position alignment for the plurality of substrates in the calculated order in the sequential substrate position alignment operation.

6. The substrate position alignment device according to claims 1, wherein the up-down mechanism includes a plurality of support column members disposed on a virtual circle having the axis as a center in such a manner that the support column members extend vertically to be spaced apart from each other in a circumferential direction of the virtual circle, a plurality of separate support element drive members provided on each of the support columnar members at height positions corresponding to the plurality of rotary tables, respectively, and up-down devices which synchronously move up and down the plurality of support column members, wherein each of the plurality of support element sets includes a plurality of support elements configured to support a plurality of peripheral edge portions in the circumferential direction, of the substrate held on the rotary table corresponding to the each of the plurality of support element sets, and wherein each of the plurality of support element set drive member units includes the plurality of separate support element drive members configured to independently support the plurality of support elements included in the support element set corresponding to the each of the plurality of support element set drive member units, and synchronously move the plurality of support elements between the inward positions and the outward positions.

7. The substrate position alignment device according to claim 1, comprising:

a base body which supports the plurality of rotary tables disposed to be vertically spaced apart from each other to hold the plurality of substrates in such a manner that the plurality of substrates are placed to extend horizontally and arranged to be vertically spaced apart from each other, the plurality of rotary tables being rotatable around the axis extending vertically;

one rotation drive source; and a rotational driving force transmission mechanism which is provided on the base body and transmits a rotational driving force of the rotation drive source to the plurality of rotary tables to synchronously rotate the plurality of rotary tables.

8. A control method of a substrate position alignment device including:

a plurality of rotary tables disposed to be vertically spaced apart from each other to hold a plurality of substrates in such a manner that the plurality of substrates are placed to extend horizontally and arranged to be vertically spaced apart from each other, the plurality of rotary tables being rotatable around an axis extending vertically;

a rotation drive device which synchronously rotates the plurality of rotary tables;

a plurality of mark position detecting units which detect rotational angle positions of marks of the plurality of substrates which are held on the plurality of rotary tables and rotated by the plurality of rotary tables, respectively;

a plurality of support element sets configured to support peripheral edge portions of the plurality of substrates to be held on the plurality of rotary tables, respectively;

a plurality of support element set drive member units configured to independently support the plurality of support element sets, respectively, and to independently move the plurality of support element sets, respectively, between inward positions at which the plurality of support element sets are located inward relative to outer peripheries of the plurality of substrates, respectively, and outward positions at which the plurality of support element sets are located outward relative to the outer peripheries of the plurality of substrates, respectively;

an up-down mechanism which moves up and down the plurality of support element set drive member units together, between high positions and low positions in a predetermined height range, a control unit which receives as inputs the rotational angle positions of the marks of the plurality of substrates which are detected by the plurality of mark position detecting units, respectively, and controls the rotation drive device, the plurality of support element set drive member units, and the up-down mechanism; and a memory unit, wherein the plurality of support element sets disposed at the high positions are set to be higher than the plurality of substrates held on the plurality of rotary tables corresponding to the plurality of support element sets, respectively, and the plurality of support element sets disposed at the low positions are set to be lower than the plurality of substrates held on the plurality of rotary tables corresponding to the plurality of support element sets, respectively, the control method comprising:

performing with the control unit, a mark position detecting operation in which the control unit causes the rotation drive device to synchronously rotate the plurality of rotary tables and causes the memory unit to store the rotational angle positions of the marks of the plurality of substrates held on the plurality of rotary tables, respectively, the rotational angle positions being detected by the plurality of mark position detecting units, respectively, and a sequential substrate position alignment operation in such a manner that the plurality of substrates sequentially go through the sequential substrate position alignment operation, the sequential substrate position alignment operation including:

position alignment performed in such a manner that the rotation drive device synchronously rotates the plurality of rotary tables to align the rotational angle position of the mark of a specified substrate of the plurality of substrates with the reference rotational angle position, using the rotational angle position of the mark of the specified substrate which is stored in the memory unit, and substrate lift-up performed in such a manner that the support element set drive member unit corresponding to the support element set corresponding to the specified substrate for which the position alignment is completed, moves the support element set to the inward position, the support element set drive member units corresponding to the support element sets corresponding to the substrates for which the position alignment is not completed, move the support element sets to the outward positions, respectively, and then the up-down mechanism moves the plurality of support element set drive member units together to the high positions, respectively, to lift-up only the substrate for which the position alignment is completed, from the rotary table.

* * * * *